United States Patent
Yu et al.

(10) Patent No.: US 7,449,952 B2
(45) Date of Patent: Nov. 11, 2008

(54) AMPLIFYING CIRCUIT HAVING A PULL-UP CIRCUIT AND A PULL-DOWN CIRCUIT FOR INCREASING SLEW RATE

(75) Inventors: Jing-Chi Yu, Miao-Li Hsien (TW);
Wen-Chi Wu, Tao-Yuan (TW);
Hsiu-Ping Lin, Hsin-Chu Hsien (TW);
Yao-Ching Wang, Chang-Hua Hsien (TW); Chi-Mo Huang, Hsin-Chu (TW)

(73) Assignee: Ili Technology Corp., Jhubei, Hsinchu County (TW)

( * ) Notice: Subject to any disclaimer, the term of this patent is extended or adjusted under 35 U.S.C. 154(b) by 119 days.

(21) Appl. No.: 11/685,776

(22) Filed: Mar. 14, 2007

(65) Prior Publication Data

US 2008/0231364 A1    Sep. 25, 2008

(51) Int. Cl.
*H03F 3/45*    (2006.01)
(52) U.S. Cl. .................. 330/255; 330/264; 330/263
(58) Field of Classification Search ................ 330/255, 330/264, 263
See application file for complete search history.

(56) References Cited

U.S. PATENT DOCUMENTS

| | | | | |
|---|---|---|---|---|
| 4,638,260 A | * | 1/1987 | Hamley | 330/254 |
| 5,285,168 A | * | 2/1994 | Tomatsu et al. | 330/253 |
| 5,399,991 A | * | 3/1995 | Moraveji | 330/255 |
| 6,366,169 B1 | * | 4/2002 | Ivanov | 330/255 |
| 6,392,485 B1 | | 5/2002 | Doi et al. | |
| 6,700,422 B2 | | 3/2004 | Tang et al. | |
| 7,342,450 B2 | * | 3/2008 | Jones | 330/253 |

* cited by examiner

*Primary Examiner*—Patricia Nguyen
(74) *Attorney, Agent, or Firm*—Winston Hsu

(57) ABSTRACT

An amplifying circuit includes an operational amplifier, a pull-up circuit and a pull-down circuit. The operational amplifier generates a first pull-up signal, a first pull-down signal and an output signal, wherein the phases of the first pull-up signal and the first pull-down signal are out of phase with the output signal. The pull-up circuit includes a first controlling module for outputting a second pull-up signal according to the first pull-up signal, and a first adjusting module for adjusting the output signal according to the second pull-up signal. The pull-down circuit includes a second controlling module for outputting a second pull-down signal according to the first pull-down signal, and a second adjusting module for adjusting the output signal according to the second pull-down signal.

13 Claims, 3 Drawing Sheets

AMPLIFYING CIRCUIT HAVING A PULL-UP CIRCUIT AND A PULL-DOWN CIRCUIT FOR INCREASING SLEW RATE

BACKGROUND OF THE INVENTION

1. Field of the Invention

The present invention relates to an amplifying circuit, particularly, to an amplifying circuit with a pull-up circuit and a pull-down circuit for increasing the slew rate of the amplifying circuit.

2. Description of the Prior Art

An LCD display is often desirable for having high resolution, small volume, a high stand by period, and low power consumption. I future designs, the driving IC of the LCD would also need chip area reduction and low power consumption. Thus an amplifier capable of enabling a system having a load is necessary for the structure of the driver IC. For such operation, however, the amplifying circuit may have the problem of static power consumption, large chip area, and low slew rate.

Please refer to FIG. 1, FIG. 1 illustrates a prior art amplifying circuit 100 that can increase the slew rate. As shown in FIG. 1, the amplifying circuit 100 comprises an operational amplifier 110, and a slew rate enhancing circuit 120. It should be noted that since the circuit structure of the operational amplifier 110 is well known by persons skilled in the art, it is omitted for brevity. The slew rate enhancing circuit 120 comprises a pull-up transistor 122 and a pull-down transistor 124, wherein the pull-up transistor 122 consist of N type MOS transistors having a first terminal (source) coupled to a output terminal of the amplifier 110, a second terminal (drain) coupled to a voltage source (Vdd), and a controlling terminal (gate) coupled to an input terminal of the amplifier 110. Additionally, the pull-down transistor 124 consists of P type MOS transistors having a first terminal (source) coupled to a output terminal of the amplifier 110 and the first terminal of the pull-up transistor 122, a second terminal (drain) coupled to ground level, and a controlling terminal (gate) coupled to an input terminal of the amplifier 110 and the controlling terminal (gate) of the pull-up transistor 122. In this way, a source follower consisting of PMOS/NMOS transistors is formed.

Operation of the prior art amplifying circuit 100 is described as follows. If the input voltage $V_i$ is larger than the output voltage $V_o$ above a threshold voltage $V_{th}$, the pull-up transistor 122 turns on and the pull-down transistor 124 turns off, such that the output voltage will rapidly pull up. Conversely, if the input voltage $V_i$ is smaller than the output voltage $V_o$ above a threshold voltage $V_{th}$, the pull-up transistor 122 turns off and the pull-down transistor 124 turns on, such that the output voltage will be rapidly pull down. The disadvantage of the prior art amplifying circuit 100 is that the voltage difference between the input terminal and the output terminal requires being greater than the threshold voltage Vth in order to turn on or off the slew rate enhancing circuit 120, so that the operation voltage region for enhancing slew rate decreases. Also, if the body effect of the source follower exists, the efficiency will become worse.

Some inventions are disclosed for solving the problem of increasing slew rate. For example, U.S. Pat. No. 6,392,485 discloses a related invention, which utilizes a feedback loop signal to control static operation of the differential input stage to solve the problem slow slew rate. Also, U.S. Pat. No. 6,700,422 discloses a source follower consisting of PMOS/NMOS transistors to solve the problem of too small a slew rate due to output stage current and load capacitance.

As described above, to achieve low static power consumption, small chip area, and high slew rate while utilizing an amplifying circuit to meet high load demands is an important problem for circuit designers.

SUMMARY OF THE INVENTION

Therefore, one objective of the present invention is to provide an amplifying circuit having a pull-up circuit and a pull-down circuit for solving above-mentioned problems.

The present invention discloses an amplifying circuit, comprising: an amplifier, for generating a first pull-up signal, a first pull-down signal according to an input signal received by an input terminal, and for generating an output signal at an output terminal, wherein both the first pull-up signal and the first pull-down signal are inversed signals of the output signal; a pull-up circuit, comprising: a first controlling module, coupled to the amplifier, for receiving the first pull-up signal and for outputting a second pull-up signal according to the first pull-up signal, wherein the first pull-up signal and the second pull-up signal substantially have the same phases; and a first adjusting module, coupled to the first controlling module and the output terminal, for adjusting the output signal according to the second pull-up signal; and a pull-down circuit, comprising: a second controlling module, coupled to the amplifier, for receiving the first pull-down signal and for outputting a second pull-down signal according to the first pull-down signal, wherein the first pull-down signal and the second pull-down signal substantially have the same phase; and a second adjusting module, coupled to the second controlling module and the output terminal, for adjusting the output signal according to the second pull-down signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
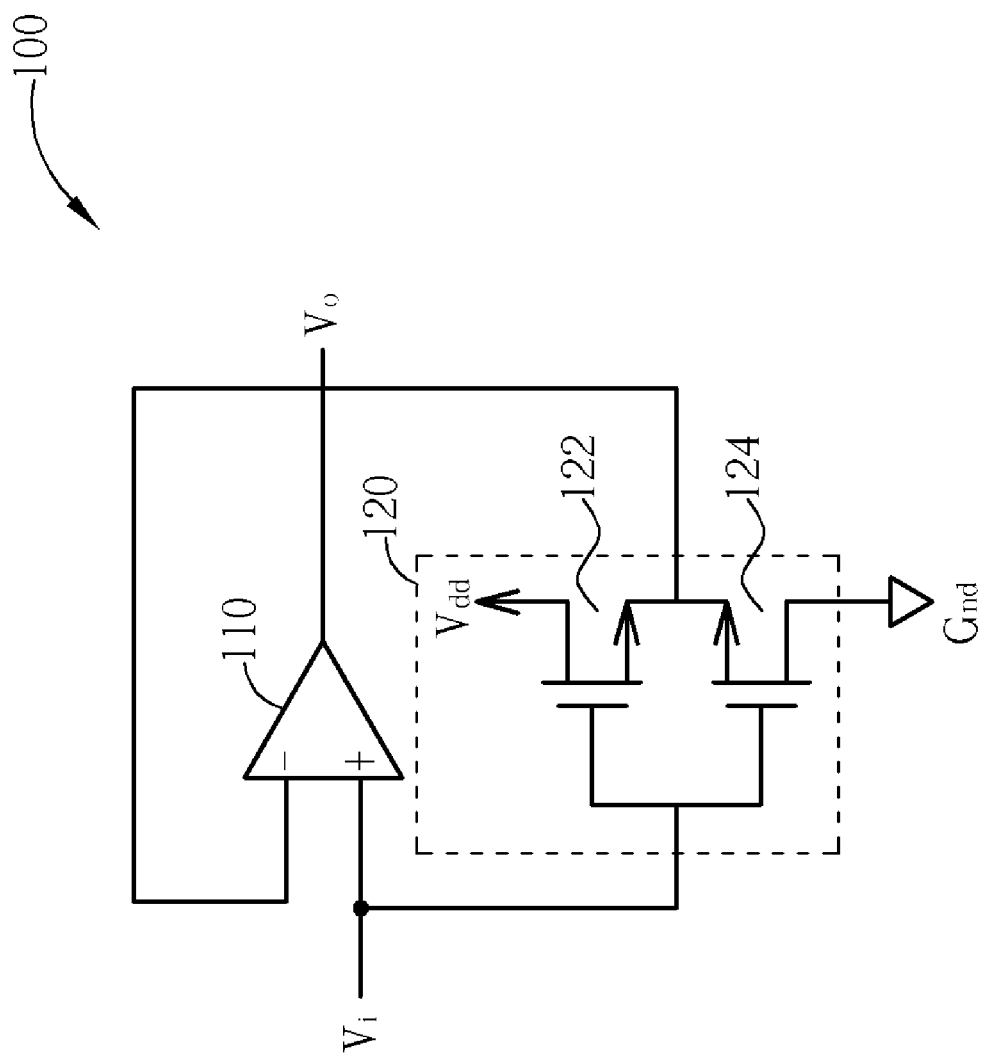
FIG. 1 illustrates a circuit diagram of the prior art amplifying circuit capable of increasing slew rate.
Figure 2:
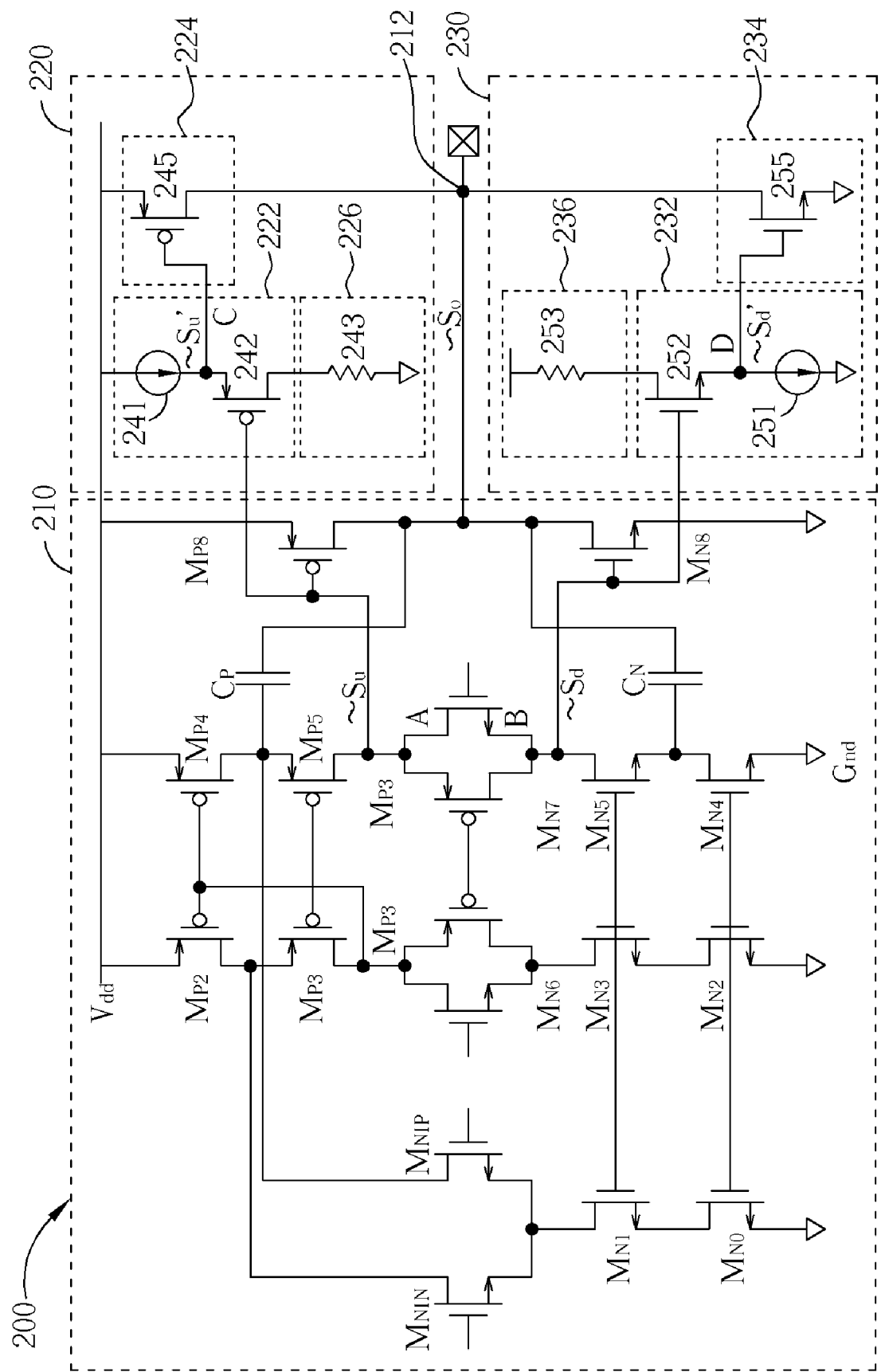
FIG. 2 illustrates a circuit diagram of the amplifying circuit according to a first embodiment of the present invention.

Please refer to FIG. 2, FIG. 2 illustrates a circuit diagram of the amplifying circuit 200 according to a first embodiment of the present invention. As shown in FIG. 2, the amplifying circuit 200 comprises an amplifier 210, a pull-up circuit 220 and a pull-down circuit 230. The amplifier 210 generates a first pull-up signal $S_u$, a first pull-down signal $S_d$ according to a input signal received by a input terminal, and generates an output signal $S_o$ at a output terminal 212. The first pull-up signal $S_u$ and the first pull-down signal $S_d$ are inverted signals of the output signal $S_o$. The pull-up circuit 220 comprises a first controlling module 222, a first adjusting module 224 and a first resistant unit 226.

The first controlling module 222, which is coupled to the amplifier 210, is used for receiving the first pull-up signal $S_u$ and for outputting a second pull-up signal $S_u'$ according to the first pull-up signal $S_u$. The first pull-up signal $S_u$ and the second pull-up signal $S_u'$ have substantially the same phase. The first adjusting module 224, which is coupled to the first controlling module 222 and the output terminal 212, is used for adjusting the output signal $S_o$ according to the second pull-up signal $S_u'$. The pull-down circuit 230 comprises a second controlling module 232, a second adjusting module 234, and a second resistant unit 236. The second controlling module 232, which is coupled to the amplifier 210, is used for receiving the first pull-down signal $S_d$ and for outputting a second pull-down signal $S_d'$ according to the first pull-down signal $S_d$. The first pull-down signal $S_d$ and the second pull-down signal $S_d'$ substantially have the same phases. The second adjusting module 234, which is coupled to the second controlling module 232 and the output terminal 232, is used for adjusting the output signal $S_o$ according to the second pull-down signal $S_d$.

According to the present invention specification, the first terminal of the transistor indicates the source terminal, the second terminal indicates the drain terminal, the first voltage level indicates a provided voltage level (that is, $V_{dd}$), and the second voltage level indicates a ground terminal (that is, $G_{nd}$). It is apparent that the first voltage level is higher than the second voltage level. As shown in FIG. 2, the amplifier 210 comprises a plurality of transistors $M_{n1}$~$M_{n8}$, $M_{p1}$~$M_{p8}$, and $M_{nin}$~$M_{nip}$. The first controlling module 222 comprises a current source 241 and a transistor 242 consisting of PMOS transistors. The current source 241 has a terminal coupled to a first voltage level. The transistor 242 has a first terminal coupled to the current source 241, a second terminal coupled to the first adjusting module 222, and a first resistant unit 226 for outputting the second pull up signal Su'. The controlling terminal of the transistor 242 is used for receiving the first pull up signal. The first resistant unit 226 comprises an equivalent resistant device 243, which can consist of N type MOS transistors, or resistors having various kinds of materials. The first adjusting module 224 can comprises a transistor 245, which has a first terminal coupled to a first voltage level, a second terminal coupled to the output terminal 212, and a controlling terminal coupled to the first controlling module 222 to receive the second pull-up signal $S_u'$.

In the pull-down circuit 230, the second controlling module 232 comprises a current source 251 and a transistor 252, which consists of N type MOS transistors, wherein one terminal of the current source 251 is coupled to the second voltage level. The transistor 252 has a first terminal coupled to the current source 251, a second terminal coupled to the second adjusting module 232, and the second resistant unit 236 outputting the second pull-down controlling signal $S_d'$, and a controlling terminal to receive the first pull-down controlling signal $S_d$. The second resistant unit 236 comprises an equivalent resistant device 253, which can consist of P type MOS transistors or resistor having various kinds of materials. The second adjusting module 232 comprises a transistor 255, which has a first terminal coupled to a second voltage level, a second terminal coupled to the output terminal 212, and a controlling terminal coupled to the second controlling module 232 to receive the second pull-down signal $S_d$.

Since the detailed structure and operation of the amplifier 210 is well-known by persons skilled in the art, it is omitted for brevity. In this embodiment, the amplifier 210 receives an input signal at the input terminal (transistors $M_{nin}$ and $M_{nip}$), while the output terminal 212 generates an output signal. The operation of the differential input stage circuit ($M_{nip}$ and $M_{nin}$) and stacked amplifying stage circuit ($M_{N2}$~$M_{N7}$ and $M_{P2}$~$M_{P7}$) acts like an inverter. That is, a first pull-up signal $S_u$, which is an inversed signal of output signal $S_o$ is generated at node A, while a first pull-down signal $S_d$, which is an inversed signal of the output signal $S_o$ is generated at node B. In other words, if the output signal $S_o$ is in a positive period, the first pull-up signal $S_u$ and the first pull-down signal $S_d$ will be inversed to the negative period. In the present invention embodiment, the first pull-up signal Su and the first pull-down signal Sd have substantially the same phases. Therefore, the first pull-down signal Sd turns off transistor 252 and generates a second pull down controlling signal Sd' at node D, while the second pull-down signal $S_d'$ turns off transistor 255. At the same time, the first pull-up signal $S_u$ drives transistor 242 to turn on and generates the second pull-up signal $S_u'$ at node C, while the second pull-up signal $S_u'$ will drive the transistor 252 to turn on. Therefore, the output signal $S_o$ is pulled up at output terminal 212. Similarly, if the output signal $S_o$ is in a negative period, than the first pull-up signal $S_u$ and the first pull-down signal $S_d$ will be inversed to the positive period. Therefore, the first pull-up signal $S_u$ drives the transistor 242 to turn off, and generates the second pull-up signal $S_u'$ at node C, and the second pull-up signal $S_u'$ will drive the transistor 252 to turn off. At the same time, the first pull-down signal $S_d$ drives the transistor 242 to turn on and generates a second pull down controlling signal $S_d'$ at node D, while the second pull-down signal $S_d'$ turns on transistor 255. Thus, the output signal So is pulled down at output terminal 212.

The first current source 241 is used for providing a bias current necessary for transistor 242. Therefore the output signal $S_o$ can be rapidly pulled up to further increase the slew rate, while output signal So is in a positive period. In this case, the first current source type can be constant current source or a voltage-controlled current source controlled by $S_u$. Additionally, transistor 245 can be rapidly turned off while the output signal $S_o$ being is in a negative period.

The second current source 251 is used for providing the bias current necessary for the transistor 252. The output signal $S_o$ therefore can be rapidly pulled down to further increase the slew rate while the output signal So is in a negative period. In this case, the second current source type can be a constant current source or a voltage-controlled current source controlled by $S_d$. Also, transistor 255 can be rapidly turned off while output signal $S_o$ is in a positive period. Therefore, the amplifying circuit 200 still can operate normally without first resistant unit 266 and second resistant unit 236.

Figure 3:
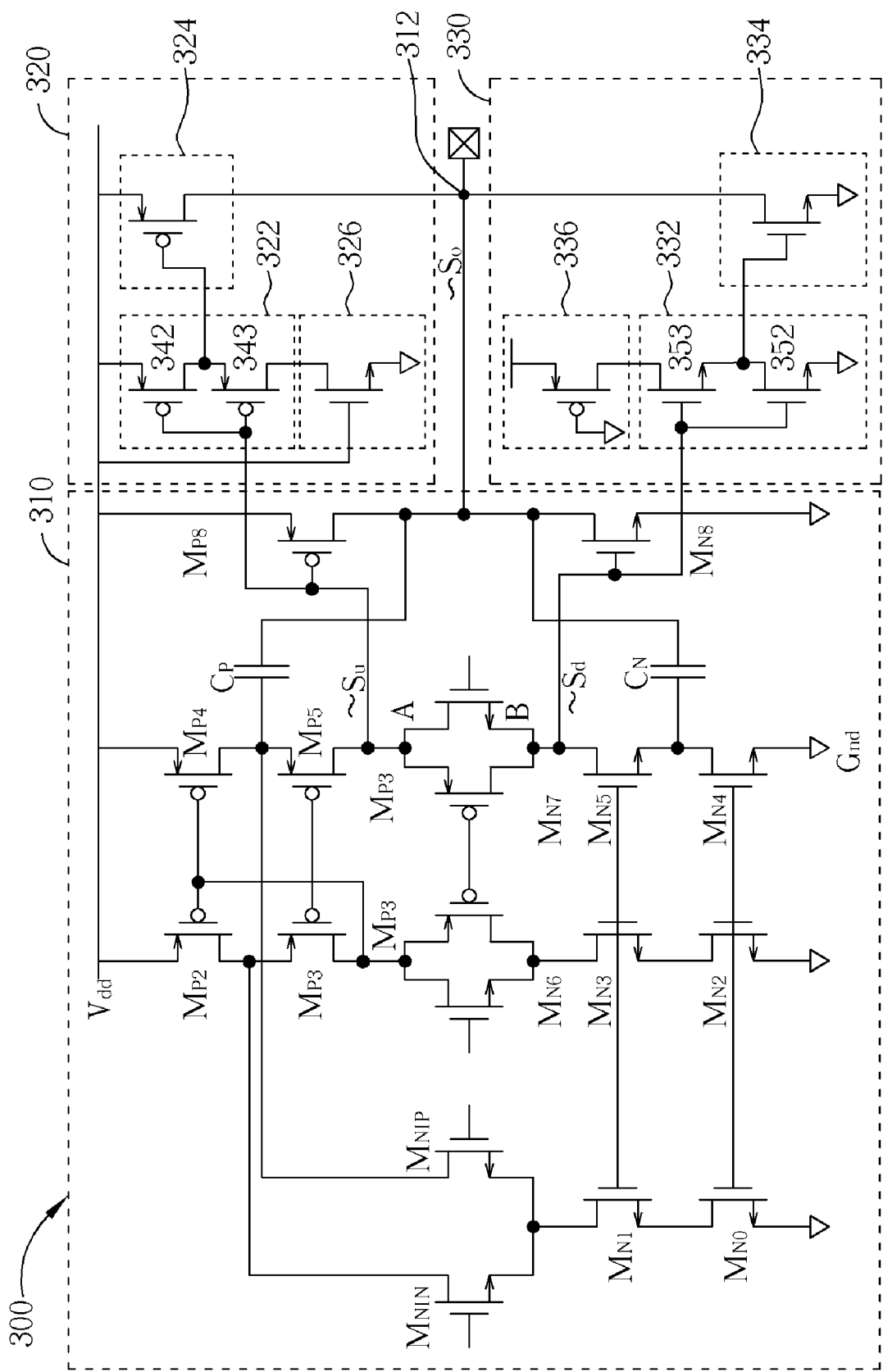
FIG. 3 illustrates a circuit diagram of the amplifying circuit according to a second embodiment of the present invention.

Please refer to FIG. 3, FIG. 3 illustrates a circuit diagram of the amplifying circuit 300 according to a second embodiment of the present invention. As shown in FIG. 3, the amplifying circuit 300 comprises an amplifier 310, a pull-up circuit 320, and a pull-down circuit 330. The amplifier 310 generates a first pull-up signal $S_u$, a first pull-down signal $S_d$ according to an input signal received by a input terminal, and generates an output signal $S_o$ at a output terminal 312. The first pull-up signal $S_u$ and the first pull-down signal $S_d$ are inverted signals of the output signal $S_o$. The pull-up circuit 320 comprises a first controlling module 322, a first adjusting module 324, and a first resistant unit 326.

The first controlling module 322, which is coupled to the amplifier 310, is used for receiving the first pull-up signal $S_u$ and for outputting a second pull-up signal $S_u'$ according to the first pull-up signal $S_u$. The first pull-up signal $S_u$ and the second pull-up signal $S_u'$ have substantially the same phases. The first adjusting module 324, which is coupled to the first controlling module 322, and the output terminal 312, is used for adjusting the output signal $S_o$. Transistor 342 is cascaded to P type transistor 343 for providing it's the necessary bias current. The pull-down circuit 330 comprises a second controlling module 332, a second adjusting module 334 and a second resistant unit 336. The second controlling module 332, which is coupled to the amplifier 310, is used for receiving the first pull-down signal $S_d$ and for outputting a second pull-down signal $S_d'$. The first pull-down signal $S_d$ and the second pull-down signal $S_d'$ have substantially the same phase. The second adjusting module 334, which is coupled to the second controlling module 332 and the output terminal 312, is used for adjusting the output signal $S_o$ according to the second pull-down signal $S_d$. Transistor 352 is cascaded to the N type transistor 353 for providing the necessary bias current.

The amplifying circuit 300 in the present embodiment is similar to the amplifying circuit 200 in FIG. 2, the main difference being that the first controlling module 322 and the second controlling module 332 are different from the first controlling module 222 and the second controlling module 232 shown in FIG. 2. In the present invention embodiment, the first controlling module 322 comprises a first transistor 342 consisting of a P type MOS transistor and a second transistor 343 consisting of a P type MOS transistors, wherein the first transistor 342 is stacked on the second transistor 343. The first transistor 342 has a first terminal coupled to a first voltage level, a second terminal coupled to the first terminal of the second transistor 343, and the first adjusting module 324. The second transistor 343 has a second terminal coupled to the first resistant unit 326, and the controlling terminals of the first transistor 342 and the second transistor 343 are used for receiving the first pull-up controlling signal $S_u$. The first controlling module 322 comprises a first transistor 352 consisting of N type MOS transistors, and a second transistor 353 consisting of N type MOS transistors, wherein the first transistor 352 is stacked on the second transistor 353. The first transistor 352 has a first terminal coupled to the second voltage level, and a second terminal coupled to the first terminal of the second transistor 353 and the second adjusting module 334. The second transistor 353 has a second terminal coupled to the second resistant unit 336, and the controlling terminals of the first transistor 352 and the second transistor 353 are used for receiving the first pull-down controlling signal $S_d$.

Please jointly refer to FIG. 2 and FIG. 3, operation of the present embodiment is similar with the above-mentioned amplifying circuit 200, with the main difference between them described as follows. In FIG. 2, transistor 242 in the first controlling module 222 is biased by the current source 242 to generate a controlling signal $S_u$, and the voltage difference between the controlling signal $S_u$ and the controlling signal $S_u'$ is equal to the voltage difference from the transistor 242 gate to the source. Also, transistor 252 in the second controlling module 232 is biased by the current source 252 to generate a controlling signal $S_d$, the voltage difference between $S_d$ and $S_d'$ is equal to the voltage difference from the gate of transistor 252 to its source. However, in the amplifying circuit 300, the first controlling module 322 utilizes the conductance Gm of the second transistor 343 being larger than the first transistor 342 to ensure that the second pull-up signal $S_u'$ has a phase substantially the same as the first pull-up signal $S_u$. Also, the $S_u$ signal can increase the current of the transistor 342 to increase the conductance when the $S_u$ signal has low voltage level.

Also, the second controlling module 332 utilizes the conductance Gm of the second transistor 353 being larger than the first transistor 352 to ensure the second pull-down signal $S_d'$ has the phase substantially the same as the first pull-down signal $S_d$. Also, the $S_d$ signal can increase the current of the transistor 352 to increase the conductance when the $S_d$ signal has a high voltage level.

It should be noted that the pull-up circuit 220 in the amplifying circuit 200 is not limited to co-operate with the pull-down circuit 230. The pull-up circuit 220 can co-operate with the pull-down circuit 330. Similarly, the pull-up circuit 320 is not limited to co-operate with the pull-down circuit 330. The pull-up circuit 320 can co-operate with the pull-down circuit 230.

Comparing with prior art, the present invention utilizes the output signal of the amplifier to control the adjusting of slew rate, as one of the pull-up circuit or the pull-down circuit is turned on if there is a voltage difference between the input signal and the output signal. That is, the pull up circuit and the pull down circuit will not turn on at the same time, so that a short will not occur. Furthermore, the present invention turns off the pull-up circuit and the pull-down circuit to reduce static current if the input voltage is similar to the output voltage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifying circuit, comprising:
    an amplifier, for generating a first pull-up signal, a first pull-down signal according to an input signal received by an input terminal, and for generating an output signal at an output terminal, wherein both the first pull-up signal and the first pull-down signal are inversed signals of the output signal;
    a pull-up circuit, including:
        a first controlling module, coupled to the amplifier for receiving the first pull-up signal and for outputting a second pull-up signal according to the first pull-up signal, wherein the first pull-up signal and the second pull-up signal have substantially the same phase;
        a first adjusting module, coupled to the first controlling module and the output terminal for adjusting the output signal according to the second pull-up signal;
    a pull-down circuit, including:
        a second controlling module coupled to the amplifier, for receiving the first pull-down signal and for outputting a second pull-down signal according to the first pull-down signal, wherein the first pull-down signal and the second pull-down signal have substantially the same phase; and
        a second adjusting module, coupled to the second controlling module and the output terminal, for adjusting the output signal according to the second pull-down signal.

2. The amplifying circuit of claim 1, wherein the pull-up circuit further comprises a first resistant unit having an end coupled to the first controlling module, and another end coupled to a voltage level.

3. The amplifying circuit of claim 1, wherein the first controlling module comprises:
    a current source, having a terminal coupled to a voltage level; and
    a transistor, having a first terminal coupled to the current source and a second terminal coupled to the first adjusting module for outputting the second pull up signal, wherein the controlling terminal of the transistor is used for receiving the first pull up signal.

4. The amplifying circuit of claim 1, wherein the first controlling module comprises:
    a stack transistor, having a first transistor stacking on a second transistor, wherein the first transistor has a first terminal coupled to a voltage level, a second terminal coupled to a first terminal of the second transistor and the first adjusting module, the control terminals of the first and second transistors respectively receive the first pull-up signal.

5. The amplifying circuit of claim 4, wherein the conductance of the second transistor is larger than the conductance of the first transistor.

6. The amplifying circuit of claim 2, wherein the first resistant unit comprises:
   a transistor, having a first terminal coupled to a second voltage level, a second terminal coupled to the first adjusting module, and a controlling terminal coupled to a first voltage level, wherein the first voltage level is higher than the second voltage level.

7. The amplifying circuit of claim 1, wherein the pull-down circuit further comprises a second resistant unit, which has an end coupled to the second controlling module and the other end coupled to a voltage level.

8. The amplifying circuit of claim 1, wherein the second controlling module comprises:
   a current source, having a terminal coupled to a voltage level; and
   a transistor, having a first terminal coupled to the current source and a second terminal coupled to the second adjusting module for outputting the second pull down signal, wherein the controlling terminal of the transistor is used for receiving the first pull down signal.

9. The amplifying circuit of claim 1, wherein the second controlling module comprises:
   a stack transistor, having a first transistor stacking on a second transistor, wherein the first transistor has a first terminal coupled to a voltage level, and the second transistor has a second terminal coupled to a first terminal of the first transistor and the second adjusting module, where the control terminals of the first, second transistors respectively receive the first pull-down signal.

10. The amplifying circuit of claim 9, wherein the conductance of the second transistor is larger than the first transistor.

11. The amplifying circuit of claim 7, wherein the second resistant unit comprises:
    a transistor, having a first terminal coupled to a first voltage level, a second terminal coupled to the second adjusting module; and a controlling terminal coupled to a second voltage level, wherein the first voltage level is higher than the second voltage level.

12. The amplifying circuit of claim 1, wherein the first adjusting module comprises:
    a transistor, having a first terminal coupled to a first voltage level, a second terminal coupled to the output terminal, and a controlling terminal coupled to the first controlling module to receive the second pull-up signal.

13. The amplifying circuit of claim 1, wherein the second adjusting module comprises:
    a transistor, having a first terminal coupled to a second voltage level, a second terminal coupled to the output terminal, and a controlling terminal coupled to the second controlling module to receive the second pull-down signal.

* * * * *